US012644188B2

(12) United States Patent
Cho et al.

(10) Patent No.: US 12,644,188 B2
(45) Date of Patent: Jun. 2, 2026

(54) METHOD OF FABRICATING SEMICONDUCTOR DEVICE USING APPARATUS FOR SUPPLYING SUPERCRITICAL FLUIDS

(71) Applicant: Samsung Electronics Co., Ltd., Suwon-si (KR)

(72) Inventors: Yong-Jhin Cho, Hwaseong-si (KR); Young Tae Kim, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 167 days.

(21) Appl. No.: 18/824,322

(22) Filed: Sep. 4, 2024

(65) Prior Publication Data

US 2024/0425988 A1 Dec. 26, 2024

Related U.S. Application Data

(62) Division of application No. 17/515,736, filed on Nov. 1, 2021, now Pat. No. 12,110,593.

(30) Foreign Application Priority Data

Nov. 3, 2020 (KR) ........................ 10-2020-0145050

(51) Int. Cl.
| | |
|---|---|
| *C23C 18/16* | (2006.01) |
| *H10P 70/00* | (2026.01) |
| *H10P 72/00* | (2026.01) |

(52) U.S. Cl.
CPC ........ *C23C 18/1685* (2013.01); *C23C 18/163* (2013.01); *H10P 70/80* (2026.01); *H10P 72/0406* (2026.01); *H10P 72/0408* (2026.01)

(58) Field of Classification Search
CPC .............. C23C 18/163; C23C 18/1685; H10P 72/0408; F26B 5/005
See application file for complete search history.

(56) References Cited

U.S. PATENT DOCUMENTS

| | | | |
|---|---|---|---|
| 3,673,042 A | 6/1972 | Mayers | |
| 6,602,351 B2 * | 8/2003 | DeYoung | .............. B08B 7/0021 257/E21.228 |

(Continued)

FOREIGN PATENT DOCUMENTS

| | | |
|---|---|---|
| JP | 5647845 B2 | 1/2015 |
| JP | 2019201201 A2 | 11/2019 |

(Continued)

*Primary Examiner* — Karl Kurple
(74) *Attorney, Agent, or Firm* — Muir Patent Law, PLLC

(57) ABSTRACT

An apparatus for fabricating a semiconductor device includes a chamber accommodating a substrate coated with a first fluid, a lower inlet which is placed in a lower wall of the chamber and providing a first supercritical fluid into the chamber, an upper inlet placed in an upper wall of the chamber and providing a second supercritical fluid into the chamber, a fluid outlet placed in the lower wall of the chamber and discharging a second fluid which is a mixture of the first fluid and the first supercritical fluid to outside of the chamber, and a drain cup placed between the lower wall of the chamber and the substrate, and having a first portion of which a width, in a horizontal direction, decreases toward the lower wall of the chamber, and a second portion which connects the first portion and the fluid outlet to each other.

2 Claims, 21 Drawing Sheets

(56) References Cited

U.S. PATENT DOCUMENTS

| | | | | |
|---|---|---|---|---|
| 6,613,157 | B2 * | 9/2003 | DeYoung | B08B 7/0021 |
| | | | | 257/E21.228 |
| 7,444,934 | B2 * | 11/2008 | Sandhu | B41F 33/00 |
| | | | | 257/E21.174 |
| 12,110,593 | B2 * | 10/2024 | Cho | C23C 18/1685 |
| 2006/0086460 | A1 * | 4/2006 | Kitamura | H10P 72/0461 |
| | | | | 156/345.31 |
| 2007/0144555 | A1 * | 6/2007 | Chen | H10P 72/0414 |
| | | | | 134/1 |
| 2010/0032097 | A1 * | 2/2010 | Ohashi | H10P 72/0424 |
| | | | | 156/345.55 |
| 2011/0247662 | A1 * | 10/2011 | Kamikawa | H10P 72/0416 |
| | | | | 134/105 |
| 2012/0080061 | A1 * | 4/2012 | Kim | H10P 72/0408 |
| | | | | 34/427 |
| 2013/0125931 | A1 * | 5/2013 | Nagamine | B08B 3/10 |
| | | | | 134/95.2 |
| 2014/0262024 | A1 * | 9/2014 | Cho | H10P 72/0402 |
| | | | | 156/345.1 |
| 2019/0080902 | A1 | 3/2019 | Choi et al. | |
| 2022/0105535 | A1 * | 4/2022 | Tsurusaki | B05C 3/109 |
| 2023/0182164 | A1 * | 6/2023 | Jeon | B05C 5/001 |
| | | | | 118/300 |

FOREIGN PATENT DOCUMENTS

| | | | |
|---|---|---|---|
| KR | 10-2018-0125764 | A | 11/2018 |
| KR | 10-2019-0041158 | A | 4/2019 |
| KR | 10-1980617 | B1 | 5/2019 |
| KR | 10-1987959 | B1 | 6/2019 |
| KR | 10-2037844 | B1 | 11/2019 |
| KR | 1020200045038 | A | 5/2020 |

* cited by examiner

Figure 3:
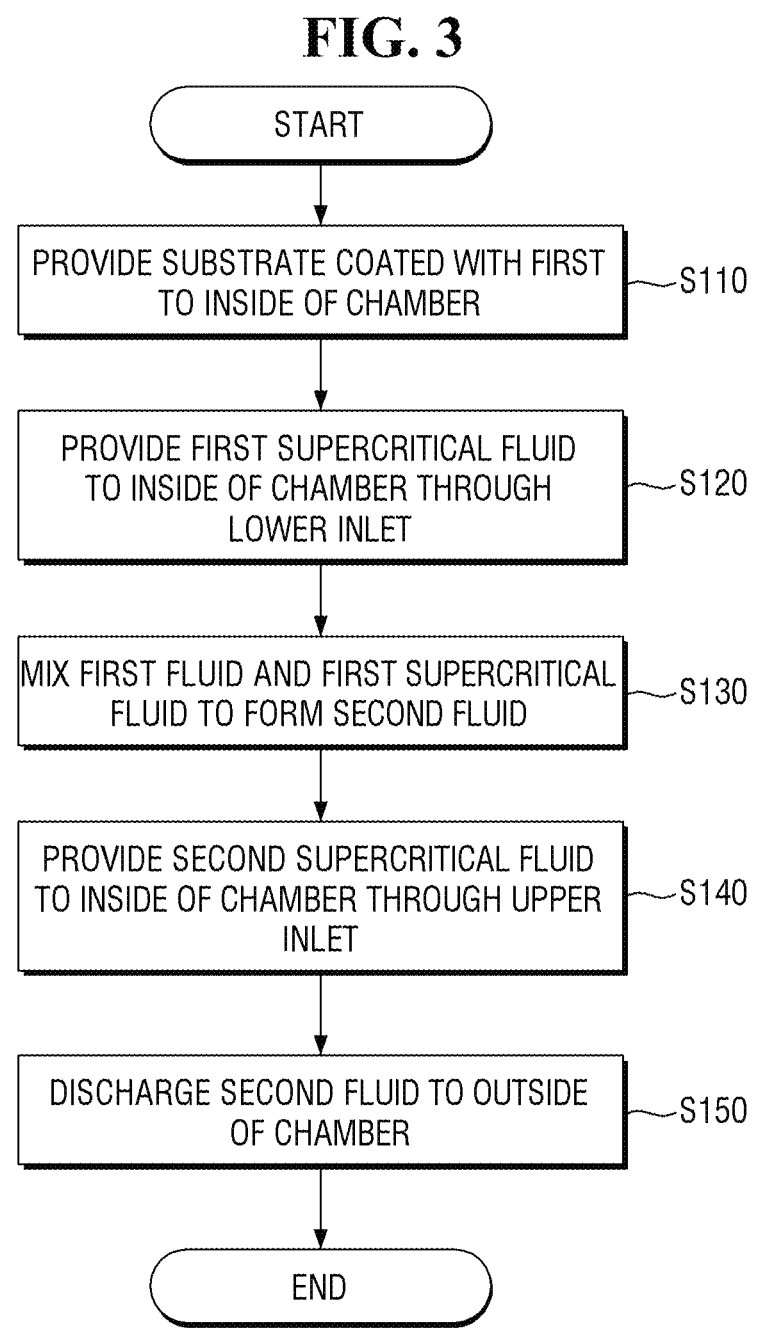

START

↓

PROVIDE SUBSTRATE COATED WITH FIRST
TO INSIDE OF CHAMBER — S110

↓

PROVIDE FIRST SUPERCRITICAL FLUID
TO INSIDE OF CHAMBER THROUGH
LOWER INLET — S120

↓

MIX FIRST FLUID AND FIRST SUPERCRITICAL
FLUID TO FORM SECOND FLUID — S130

↓

PROVIDE SECOND SUPERCRITICAL FLUID
TO INSIDE OF CHAMBER THROUGH UPPER
INLET — S140

↓

DISCHARGE SECOND FLUID TO OUTSIDE
OF CHAMBER — S150

↓

END

METHOD OF FABRICATING SEMICONDUCTOR DEVICE USING APPARATUS FOR SUPPLYING SUPERCRITICAL FLUIDS

CROSS-REFERENCE TO RELATED APPLICATION

This application is a divisional of U.S. application Ser. No. 17/515,736 filed on Nov. 1, 2021 which claims priority from Korean Patent Application No. 10-2020-0145050 filed on Nov. 3, 2020 in the Korean Intellectual Property Office, and all the benefits accruing therefrom under 35 U.S.C. 119, the contents of each of which in its entirety are herein incorporated by reference.

BACKGROUND

1. Technical Field

The present disclosure relates to an apparatus for processing a substrate and a method for processing a substrate using the same.

2. Description of the Related Art

When a highly integrated semiconductor device such as an LSI (Large scale integration) is manufactured on a surface of a semiconductor wafer, it is desirable to form an ultra-fine pattern on the wafer surface.

Such an ultra-fine pattern may be formed by patterning a resist through various processes such as exposing, developing, and cleaning a wafer coated with resist, and then etching the wafer to transfer the resist pattern onto the wafer.

A process of cleaning the wafer may be performed to remove dirt or a natural oxide film on the wafer surface after the etching. The cleaning process may be performed by immersing the wafer with a pattern formed on the surface in a treatment liquid such as a chemical liquid or a rinsing liquid, or by supplying the treatment liquid to the wafer surface.

When the treatment liquid is dried after performing the cleaning process in accordance with the high integration of the semiconductor device, the pattern on the surface of the resist or the wafer may collapse.

Recently, a treatment method for drying a treatment liquid using a fluid in a supercritical state (hereinafter referred to as 'supercritical fluid') that does not form an interface with a gas or liquid has attracted attention.

SUMMARY

The present disclosure provides an apparatus and a method for processing a substrate which prevent contaminated fluid from being provided to a substrate again, by causing the supercritical fluid to flow into the chamber through two paths, and separating a path through which the supercritical fluid flows in, and a path through which the supercritical fluid discharges, using a drain cup. As a result, the apparatus and method for processing the substrate may reduce the number of particles remaining on the substrate after the drying process.

According to an embodiment of the present inventive concept, a method of fabricating a semiconductor device includes providing a substrate to an inside of a chamber, the substrate being coated with a first fluid, providing a first supercritical fluid to the inside of the chamber through a lower inlet formed in a lower wall of the chamber, storing a second fluid formed by a mixture of the first fluid and the first supercritical fluid inside a drain cup placed between the lower wall of the chamber and the substrate, providing a second supercritical fluid to the inside of the chamber through an upper inlet formed in an upper wall of the chamber, and discharging the second fluid stored in the drain cup to the outside of the chamber through a fluid outlet formed in the lower wall of the chamber. The drain cup includes a first portion of which a width, in a horizontal direction, decreases toward the lower wall of the chamber, and a second portion which connects the first portion and the fluid outlet to each other. The chamber includes a first region and a second region separated by the drain cup, the first region being formed between the drain cup and an inner wall of the chamber, and the second region being surrounded by the drain cup. The first supercritical fluid is provided to the first region, and the second supercritical fluid is provided to the second region.

According to an embodiment of the present inventive concept, an apparatus for fabricating a semiconductor device includes a chamber accommodating a substrate coated with a first fluid, a lower inlet which is placed in a lower wall of the chamber and providing a first supercritical fluid into the chamber, an upper inlet placed in an upper wall of the chamber and providing a second supercritical fluid into the chamber, a fluid outlet placed in the lower wall of the chamber and discharging a second fluid which is a mixture of the first fluid and the first supercritical fluid to outside of the chamber, and a drain cup placed between the lower wall of the chamber and the substrate, and having a first portion of which a width, in a horizontal direction, decreases toward the lower wall of the chamber, and a second portion which connects the first portion and the fluid outlet to each other.

According to an embodiment of the present inventive concept, an apparatus for fabricating a semiconductor device includes a chamber accommodating a substrate coated with a first fluid, and including a first region and a second region, a drain cup which is placed between a lower wall of the chamber and the substrate, includes a first portion of which a width, in a horizontal direction, decreases toward the lower wall of the chamber, and a second portion which connects the first portion to the lower wall of the chamber, and separates the first region and the second region, a lower inlet which is placed in the lower wall of the chamber and provides a first supercritical fluid into the chamber, and an upper inlet which is placed in the upper wall of the chamber, and provides a second supercritical fluid into the chamber. The first region is a region between the drain cup and an inner wall of the chamber, and the second region is a region surrounded by the drain cup.

According to an embodiment of the present inventive concept, an apparatus for fabricating a semiconductor device includes a chamber, an upper support disposed in an inside of the chamber and supporting a substrate coated with a first fluid, a funnel disposed in the inside of the chamber and having an upper end and a lower end, the funnel being gradually narrowed from the upper end to the lower end, and the upper end being lower than a bottom end of the upper support, a first inlet connected to the chamber and providing a first supercritical fluid to an outer surface of the funnel, the outer surface of the funnel guiding the first supercritical fluid to the upper end of the funnel so that the first supercritical fluid flows to the substrate to form a mixture of the first fluid and the first supercritical fluid, a second inlet connected to the chamber and providing a second supercritical fluid to an upper surface of the substrate, and a fluid outlet connected to the lower end of the funnel to discharge, by the second supercritical fluid, a second fluid collected in the inside of the funnel to an outside of the chamber. The second fluid is the mixture of the first fluid and the first supercritical fluid which flows from the substrate to the inside of the funnel.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof referring to the attached drawings, in which:

FIG. 2 is a plan view for explaining the substrate processing apparatus shown in FIG. 1;

FIG. 3 is a flowchart for explaining a substrate processing method according to some embodiments of the present disclosure;

FIGS. 4 to 8 are intermediate stage diagrams for explaining a substrate processing method according to some embodiments of the present disclosure;

FIG. 15 is a plan view for explaining the substrate processing apparatus shown in FIG. 14;

DETAILED DESCRIPTION OF THE EMBODIMENTS

Hereinafter, a substrate processing apparatus according to some embodiments of the present disclosure will be described referring to FIGS. 1 and 2.

Figure 1:
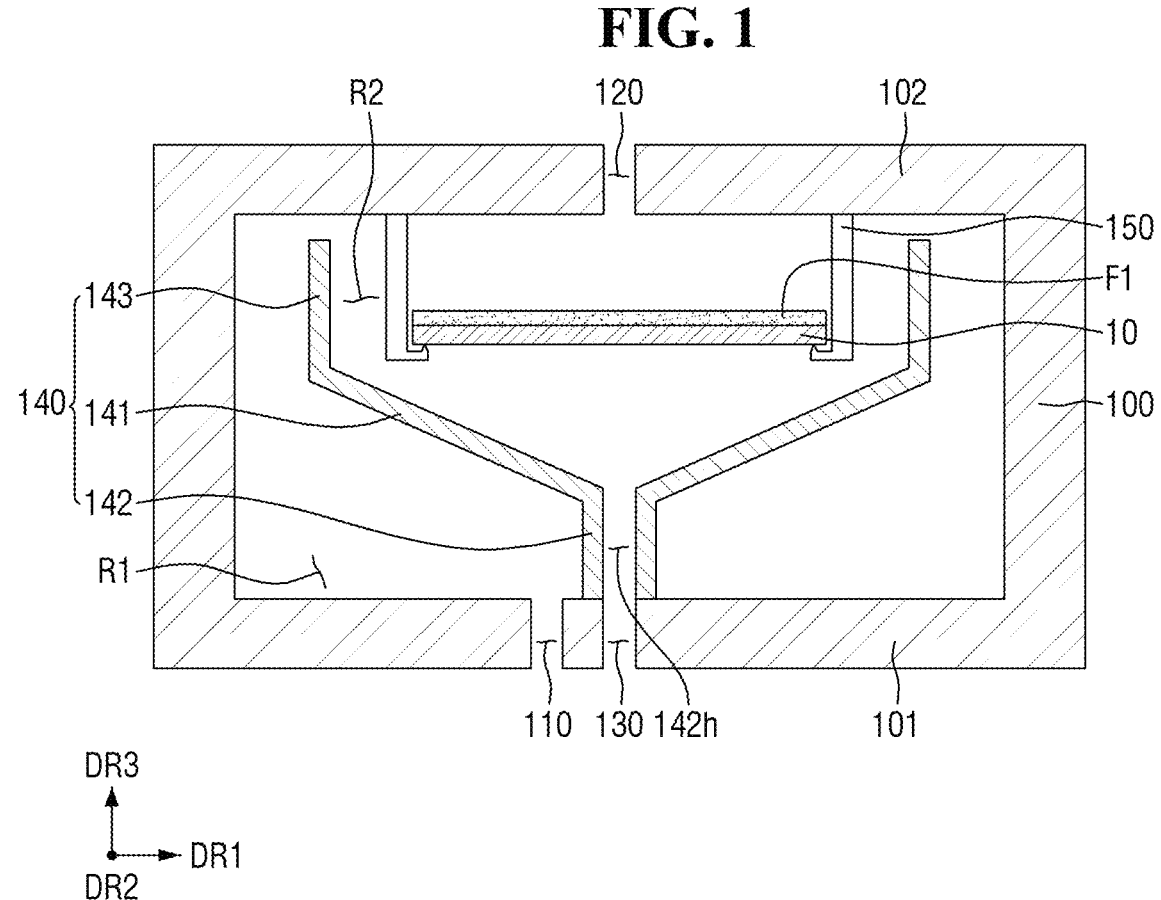
FIG. 1 is a diagram for explaining a substrate processing apparatus according to some embodiments of the present disclosure.

FIG. 1 is a diagram for explaining a substrate processing apparatus according to some embodiments of the present disclosure. FIG. 2 is a plan view for explaining the substrate processing apparatus shown in FIG. 1.

The substrate processing apparatus according to some embodiments of the present disclosure may dry a substrate 10 for which a rinsing process is completed. After the rinsing process is completed, a first fluid F1 may remain on a surface of the substrate 10. The first fluid F1 may include a rinse liquid. The first fluid F1 may include, for example, isopropyl alcohol (IPA). In some embodiments, the first fluid F1 may include one of methyl ethyl ketone and tert-butanol.

The substrate processing apparatus may dry the substrate 10 by utilizing a supercritical fluid. The supercritical fluids (SF1 of FIG. 4 and SF2 of FIG. 7) may include or may be formed of, for example, carbon dioxide ($CO_2$). However, the technical idea of the present disclosure is not limited thereto. In some embodiments, the supercritical fluid (SF1 of FIG. 4 and SF2 of FIG. 7) may include or may be formed of at least one of $CF_4$, $Xe$, $C_2F_6$, $N_2O$, $SF_6$, $Cl_2$ and $H_2O$. In an embodiment, the rinsing process and the dry process may be performed in the same chamber. The present inventive concept is not limited thereto. The dry process may be performed in a chamber different from a chamber in which the rinsing process is performed.

Carbon dioxide ($CO_2$) of the supercritical state may have a supercritical state, for example, when the temperature is raised to 30° C. or higher and the pressure is maintained at 7.4 MPa or higher. Hereinafter, for the sake of description, an example in which the supercritical fluid (SF1 of FIG. 4 and SF2 of FIG. 7) include carbon dioxide ($CO_2$) will be explained.

Figure 2:
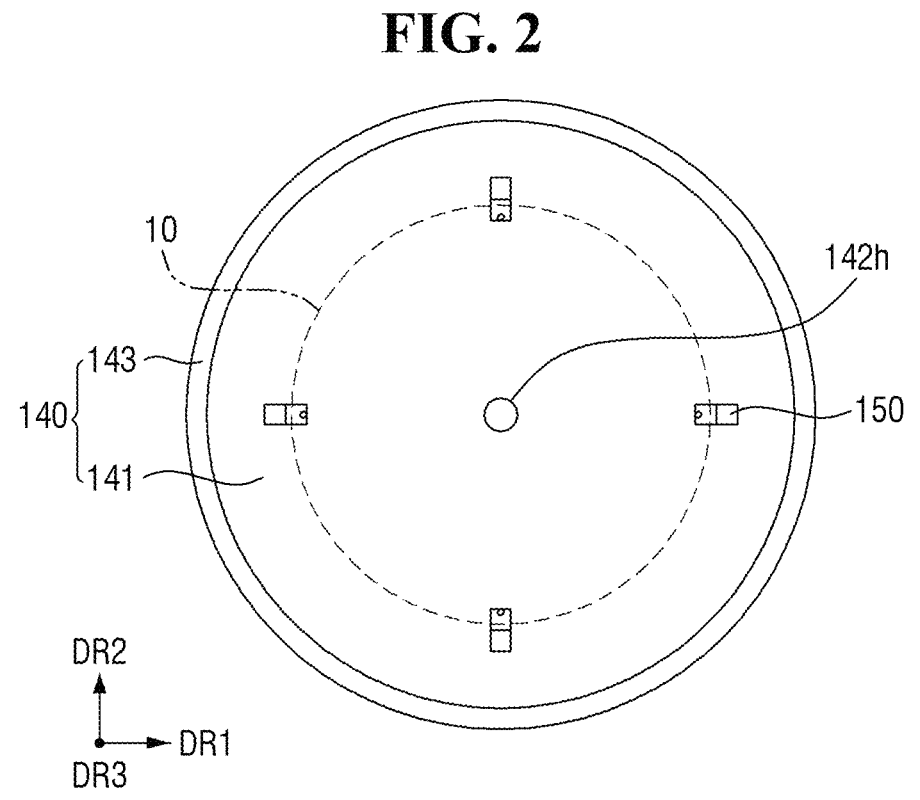

Referring to FIGS. 1 and 2, the substrate processing apparatus according to some embodiments of the present disclosure includes a chamber 100, a lower inlet 110, an upper inlet 120, a fluid outlet 130, a drain cup 140, and an upper support 150. For example, the lower inlet 110 and the upper inlet 120 may be an inlet which is a hole in the wall, or may additionally include a structure formed in the hole that allows fluids to pass therethrough, and the fluid outlet 130 may be an outlet which is a hole in the wall, or may additionally include a structure formed in the hole that allows fluids to pass therethrough. A valve may be connected to each of the lower inlet 110, the upper inlet 120, and the fluid outlet 130, and may operate to control the flow via respective one of the lower inlet 110, the upper inlet 120, and the fluid outlet 130. For the simplicity of drawings, the valve is omitted from the drawings.

The chamber 100 may provide a space in which the drying process of the substrate 10 is performed. The chamber 100 may include substances which withstand the critical temperature and pressure of the supercritical fluid (SF1 of FIG. 4 and SF2 of FIG. 7). The substrate 10 coated with the first fluid F1 may be provided to the inside of the chamber 100.

The lower inlet 110 may be placed on a lower wall 101 of the chamber 100. For example, the lower inlet 110 may be connected to the lower wall 101. The lower inlet 110 may be placed below the drain cup 140. The lower inlet 110 may penetrate, for example, the lower wall 101 of the chamber 100 to be connected to the space defined by the chamber 100. The first supercritical fluid (SF1 of FIG. 4) may flow into the chamber 100 through the lower inlet 110.

The upper inlet 120 may be placed on the upper wall 102 of the chamber 100. For example, the upper inlet 120 may be connected to the upper wall 102 of the chamber 100. The upper inlet 120 may be placed above the drain cup 140. The upper inlet 120 may penetrate, for example, the upper wall 102 of the chamber 100 to be connected to the space defined by the chamber 100. The second supercritical fluid (SF2 of FIG. 7) may flow into the chamber 100 through the upper inlet 120.

The fluid outlet 130 may be placed on the lower wall 101 of the chamber 100. For example, the fluid outlet 130 may be connected to the lower wall 101 of the chamber 100. The fluid outlet 130 may be placed below the drain cup 140. The fluid outlet 130 may be placed separately from the lower inlet 110. For example, the fluid outlet 130 may be spaced apart from the lower inlet 110.

The fluid outlet 130 may penetrate, for example, the lower wall 101 of the chamber 100. The second fluid (F2 of FIG. 7), which is a mixture of the first fluid F1 and the first supercritical fluid SF1, may be discharged to the outside of the chamber 100 through the fluid outlet 130.

The drain cup 140 may be placed between the substrate 10 and an inner wall of the chamber 100. The drain cup 140 may have a cup shape. At least a part of the drain cup 140 may include a portion of which a width, in a first horizontal direction DR1, decreases toward the lower wall 101 of the chamber 100. The upper part of the drain cup 140 may have an open shape. The lower part of the drain cup 140 may be connected to the fluid outlet 130.

Although FIG. 2 shows that the drain cup 140 has a circular shape on a plane defined by a first horizontal direction DR1 and a second horizontal direction DR2 perpendicular to the first horizontal direction DR1, the technical idea of the present disclosure is not limited thereto.

The drain cup 140 may separate the interior (i.e., the space) of the chamber 100 into a first region R1 and a second region R2. The first region R1 of the chamber 100 may include a region between the drain cup 140 and the side wall of the chamber 100, and a region between the drain cup 140 and the lower wall 101 of the chamber 100. The second region R2 of the chamber 100 may include a region surrounded by the drain cup 140 (i.e., the inside of the drain cup 140).

The substrate 10 may be placed in the second region R2 of the chamber 100. The lower inlet 110 may be connected to the first region R1 of the chamber 100. The first supercritical fluid (SF1 of FIG. 4) may be provided to the first region R1 of the chamber 100 through the lower inlet 110. The upper inlet 120 may be connected to the top of the second region R2 of the chamber 100. The second supercritical fluid (SF2 of FIG. 7) may be provided to the second region R2 of the chamber 100 through the upper inlet 120.

The drain cup 140 may include a first portion 141 (i.e., a funnel), a second portion 142, and a third portion 143 (i.e., a shield). The first portion 141 of the drain cup 140 may be placed between the substrate 10 and the lower wall 101 of the chamber 100. The first portion 141 of the drain cup 140 may have an inclined profile from the lower wall 101 of the chamber 100. The first portion 141 of the drain cup 140 may have a cup shape formed concavely toward the lower wall 101 of the chamber 100. For example, a width of the first portion 141 of the drain cup 140 in the first horizontal direction DR1 may decrease toward the lower wall 101 of the chamber 100. The width of the first portion 141 of the drain cup 140 in the first horizontal direction DR1 may be greater than the width of the substrate 10 in the first horizontal direction DR1. For example, the first portion 141 (i.e., the funnel) of the drain cup 140 may be gradually narrowed from an upper end of the first portion 141 to a lower end thereof to facilitate the collection of the second fluid (F2 of FIG. 7), which is a mixture of the first fluid F1 and the first supercritical fluid SF1, and the discharge thereof to the outside of the chamber 100 through the fluid outlet 130.

The second portion 142 of the drain cup 140 may be placed between the first portion 141 of the drain cup 140 and the lower wall 101 of the chamber 100. The second portion 142 of the drain cup 140 may connect the first portion 141 of the drain cup 140 and the fluid outlet 130. For example, the second portion 142 may be connected to the lower end of the first portion 141.

A drain hole 142h may be formed inside the second portion 142 of the drain cup 140. The drain hole 142h may be connected to the fluid outlet 130. The drain hole 142h may overlap the fluid outlet 130 in the vertical direction DR3. However, the technical idea of the present disclosure is not limited thereto.

A third portion 143 of the drain cup 140 may be connected to the first portion 141 of the drain cup 140. The substrate 10 may be placed to be surrounded by the third portion 143 of the drain cup 140. However, the technical idea of the present disclosure is not limited thereto. In some embodiments, the substrate 10 may be disposed to be surrounded by the first portion 141 of the drain cup 140.

The third portion 143 of the drain cup 140 may extend from the first portion 141 of the drain cup 140 toward the upper wall 102 of the chamber 100. Although FIG. 1 shows that the third portion 143 of the drain cup 140 extends from the first portion 141 of the drain cup 140 in a vertical direction DR3, the technical idea of the present disclosure is not limited thereto.

The third portion 143 of the drain cup 140 may be spaced apart from the upper wall 102 of the chamber 100 in the vertical direction DR3. Through the spaced space between the third portion 143 of the drain cup 140 and the upper wall 102 of the chamber 100, the first supercritical fluid (SF1 of FIG. 4) may be provided from the first region R1 of the chamber 100 to the second region R2 of the chamber 100.

The upper support 150 may be connected to the upper wall 102 of the chamber 100. The upper support 150 may extend from the upper wall 102 of the chamber 100 to the second region R2 of the chamber 100. For example, a distal end of the upper support 150 may have a ring shape.

The upper support 150 may support the substrate 10. For example, the upper support 150 may be a ring-shaped upper support, and the substrate 10 may be supported by the distal ends of the ring-shaped upper support. Although FIG. 2 shows that the upper support 150 has four upper supports, this is for convenience of explanation, and the number of the upper supports is not limited thereto. The first portion 141 of the drain cup 140 may include an upper end having a first width and a lower end having a second with smaller than the first width. The first width may be greater than a distance between two opposite upper supports among the four supports of the upper support 150. The upper end of the first portion 141 may be lower than a bottom end of the upper support 150 (i.e., a bottom end of each of the four supports).

Although the configuration in which the lower inlet 110 for providing the first supercritical fluid SF1 and the fluid outlet 130 for discharging the second fluid F2 are disposed in the lower wall 101 of the chamber 100 (e.g., located at the lower wall 101), and the upper inlet 120 for providing the second supercritical fluid SF2 is placed on the upper wall 102 of the chamber 100 (or is connected to the upper wall 102) has been explained above, the technical idea of the present disclosure is not limited thereto.

In some embodiments, the lower inlet 110 that provides the first supercritical fluid SF1 and the fluid outlet 130 through which the second fluid F2 is discharged may be placed in a first sidewall of the chamber 100 (e.g., located at the first sidewall), and the upper inlet 120 which provides the second supercritical fluid SF2 may be placed on a second sidewall of the chamber 100 (or connected to the second sidewall). In an embodiment, this first sidewall of the chamber 100 may be opposite to this second sidewall of the chamber 100. The present inventive concept is not limited thereto. Sidewalls described as a first and second sidewall of the chamber 100 may be on the same side of the chamber 100.

In some embodiments, the lower inlet 110 which provides the first supercritical fluid SF1 and the fluid outlet 130 through which the second fluid F2 is discharged may be placed in a sidewall of the chamber 100 (e.g., located at the sidewall), and the upper inlet 120 which provides the second supercritical fluid SF2 may be placed in the upper wall 102 of the chamber 100 (e.g., located at the upper wall 102).

In some embodiments, the lower inlet 110 which provides the first supercritical fluid SF1 and the fluid outlet 130 through which the second fluid F2 is discharged may be placed in the lower wall 101 of the chambers 100 (e.g., located at the lower wall 101), and the upper inlet 120 which provides the second supercritical fluid SF2 may be placed in a sidewall of the chamber 100 (e.g., located at the sidewall).

Hereinafter, a substrate processing method according to some embodiments of the present disclosure will be described referring to FIGS. 3 to 8.

FIG. 3 is a flowchart for explaining the substrate processing method according to some embodiments of the present disclosure. FIGS. 4 to 8 are intermediate stage diagrams for explaining the substrate processing method according to some embodiments of the present disclosure.

Figure 4:
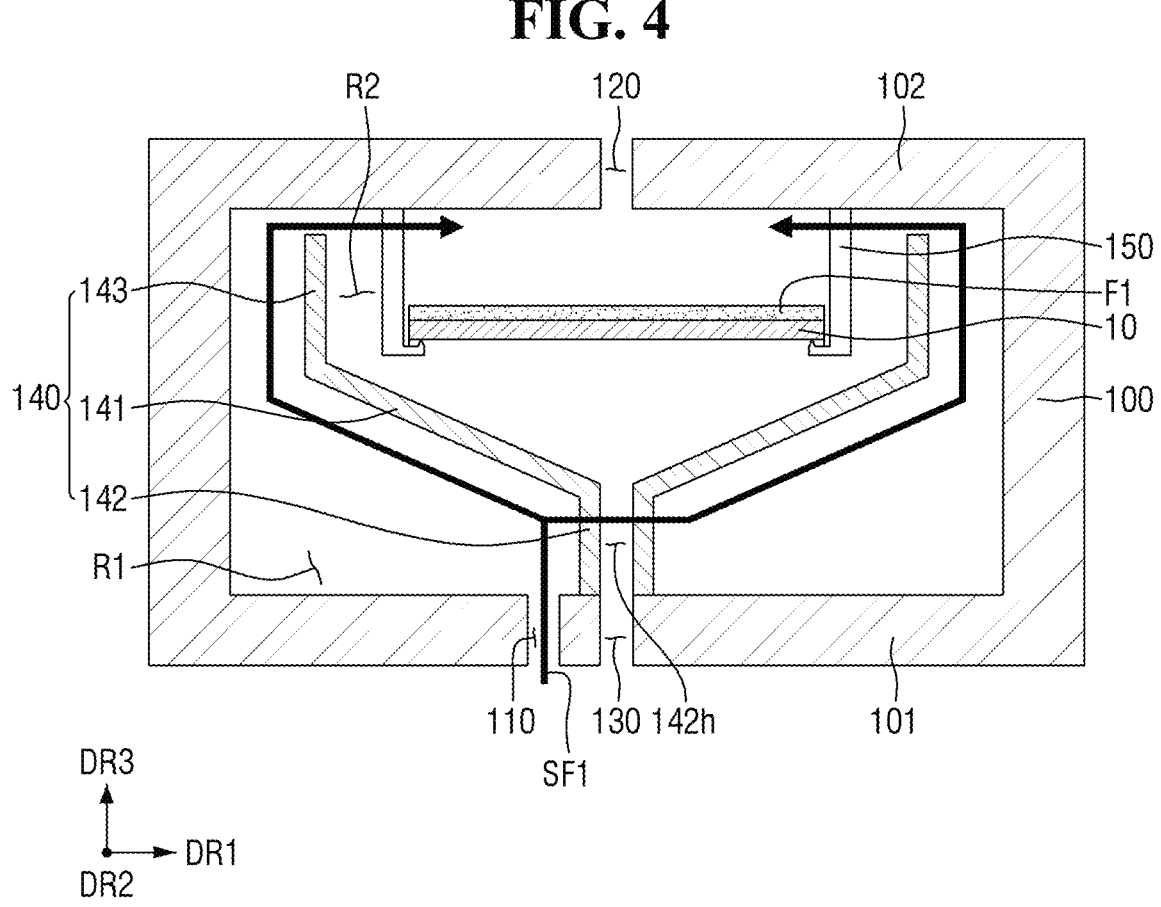

Referring to FIGS. 3 and 4, the substrate 10 coated with the first fluid F1 may be provided to the inside of the chamber 100 (S110). The present invention is not limited thereto. For example, a substrate 10 may be provided to the inside of the chamber 100, and a rinse process may be performed on the substrate in the chamber so that the first fluid F1 may remain on the substrate, and the steps S120 to S150 may be performed in the same chamber where the rinsing process is performed.

The substrate 10 provided to the inside of the chamber 100 may be supported by the upper support 150. The first fluid F1 may include, for example, isopropyl alcohol (IPA). In some embodiments, the first fluid F1 may include one of methyl ethyl ketone and tert-butanol.

Subsequently, the first supercritical fluid SF1 may be provided to the inside of the chamber 100 through the lower inlet 110. The first supercritical fluid SF1 may be provided to the first region R1 of the chamber 100. The first supercritical fluid SF1 provided to the first region R1 of the chamber 100 may flow into the second region R2 of the chamber 100 through a space between the drain cup 140 and the upper wall 102 of the chamber 100. For example, an outer surface of the drain cup 140 may guide the first supercritical fluid SF1 to the upper end of the drain cup 140 which is adjacent to a blocking region defined by the upper wall 102 of the chamber 100 and a sidewall thereof. The sidewall may connect the upper wall 102 to the lower wall 101. The guided first supercritical fluid SF1 may flow from the blocking region, which is in the first region R1 of the chamber 100, into the second region R2 of the chamber 100. The first supercritical fluid SF1 may include or may be formed of, for example, carbon dioxide ($CO_2$). In some embodiments, the first supercritical fluid SF1 may include or may be formed of at least one of $CF_4$, Xe, $C_2F_6$, $N_2O$, $SF_6$, $Cl_2$ and $H_2O$.

Figure 5:
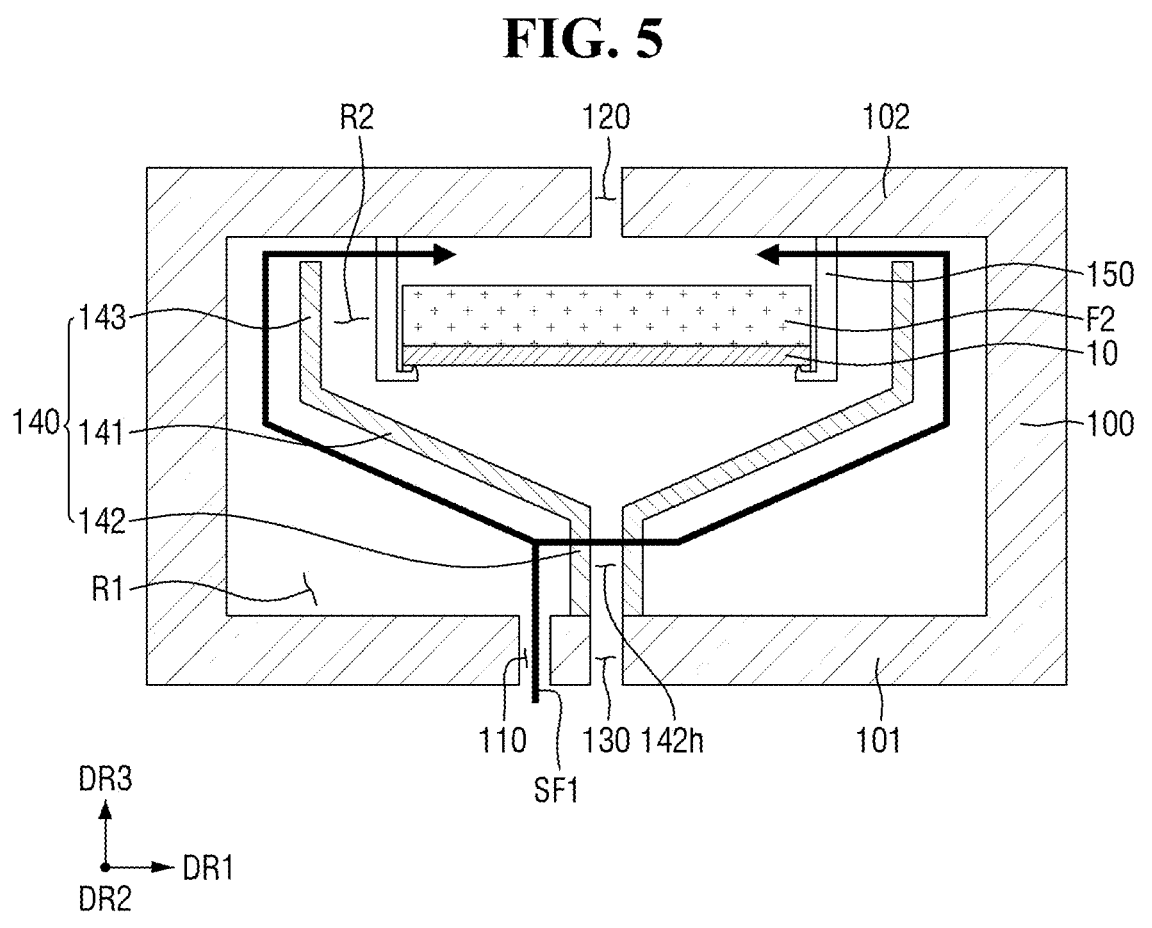

Referring to FIGS. 3 and 5, the first supercritical fluid SF1 flowing into the second region R2 of the chamber 100 may be mixed with the first fluid F1 coated onto the substrate 10 to form a second fluid F2 (S130).

As the first supercritical fluid SF1 is additionally mixed with the first fluid F1 coated on the substrate 10, the volume of the second fluid F2 may gradually increase.

Figure 6:
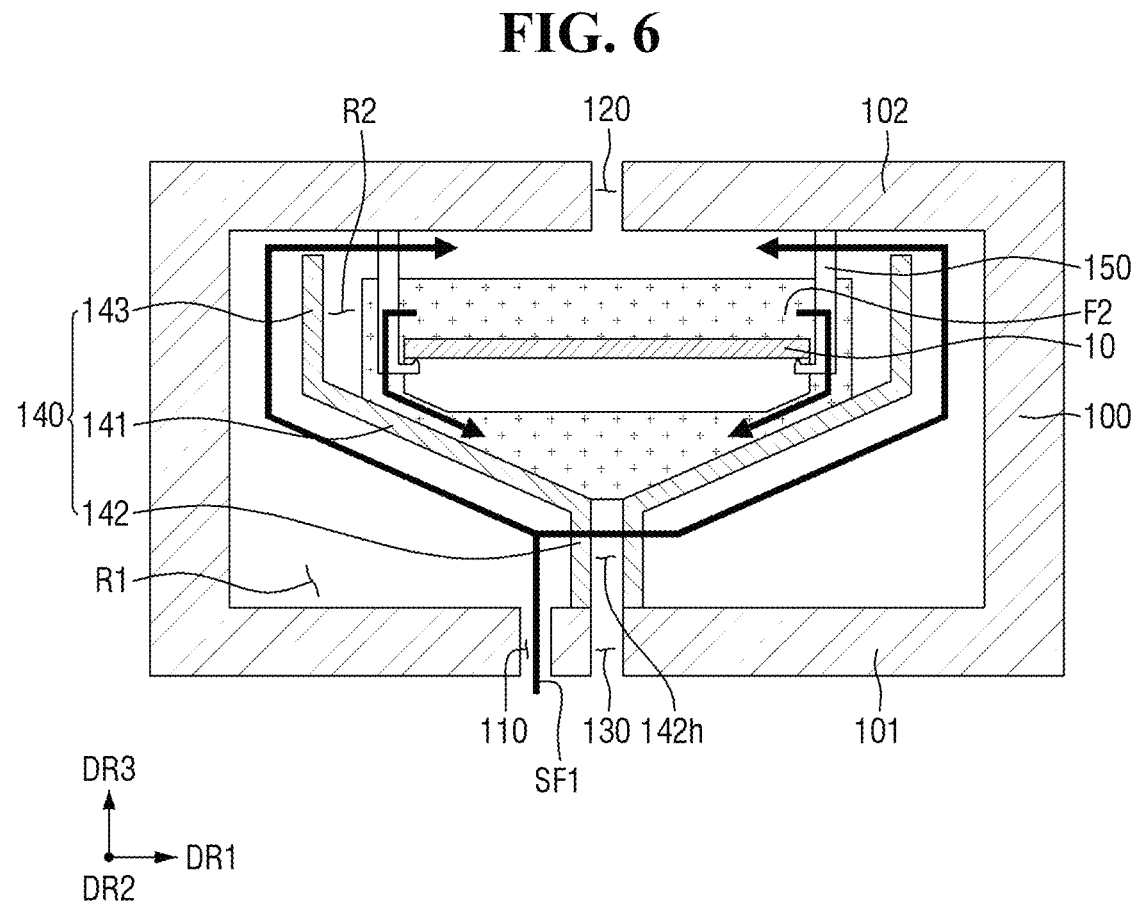

Referring to FIG. 6, the volume of the second fluid F2 may gradually increases and overflow from the side faces of the substrate 10. The second fluid F2, which overflows from the side faces of the substrate 10. The overflowed second fluid F2 may be stored the inside of the drain cup 140. For example, the drain cup 140 may collect the overflowed second fluid F2.

Figure 7:
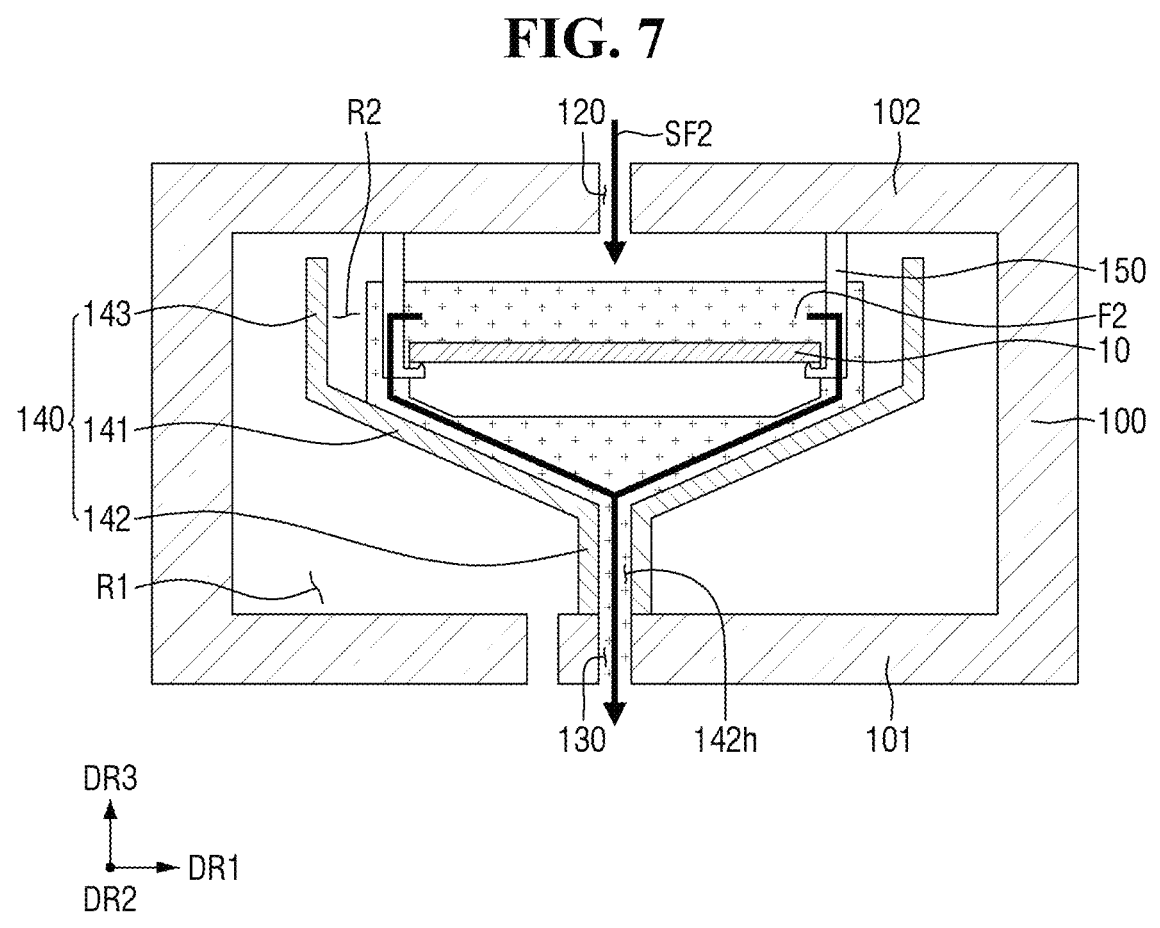

Referring to FIGS. 3 and 7, the second supercritical fluid SF2 may be provided to the inside of the chamber 100 through the upper inlet 120 (S140). The second supercritical fluid SF2 may be provided to the second region R2 of the chamber 100. In an embodiment, the second supercritical fluid SF2 is directly provided to the second region R2.

The first supercritical fluid SF1 may be continuously provided to the inside of the chamber 100 until the second supercritical fluid SF2 is provided to the inside of the chamber 100. For example, the supply of the first supercritical fluid SF1 may be stopped before the second supercritical fluid SF2 is provided to the inside of the chamber 100. However, the technical idea of the present disclosure is not limited thereto. In some embodiments, while the second supercritical fluid SF2 is being provided to the inside of the chamber 100, the first supercritical fluid SF1 may also be provided to the inside of the chamber 100.

The second supercritical fluid SF2 may include or may be formed of, for example, carbon dioxide ($CO_2$). In some embodiments, the second supercritical fluid SF2 may include or may be formed of at least one of $CF_4$, Xe, $C_2F_6$, $N_2O$, $SF_6$, $Cl_2$ and $H_2O$. In an embodiment, the first supercritical fluid SF1 and the second supercritical fluid SF2 may be formed of the same substance as each other. The technical idea of the present disclosure is not limited thereto. In some embodiments, the second supercritical fluid SF2 may include or may be formed of a substance different from the first supercritical fluid SF1.

Subsequently, the second fluid F2 stored in the drain cup 140 may be discharged to the outside of the chamber 100 through the drain hole 142h and the fluid outlet 130, by utilizing the pressure of the second supercritical fluid SF2 provided to the second region R2 of the chamber 100 (S150).

Figure 8:
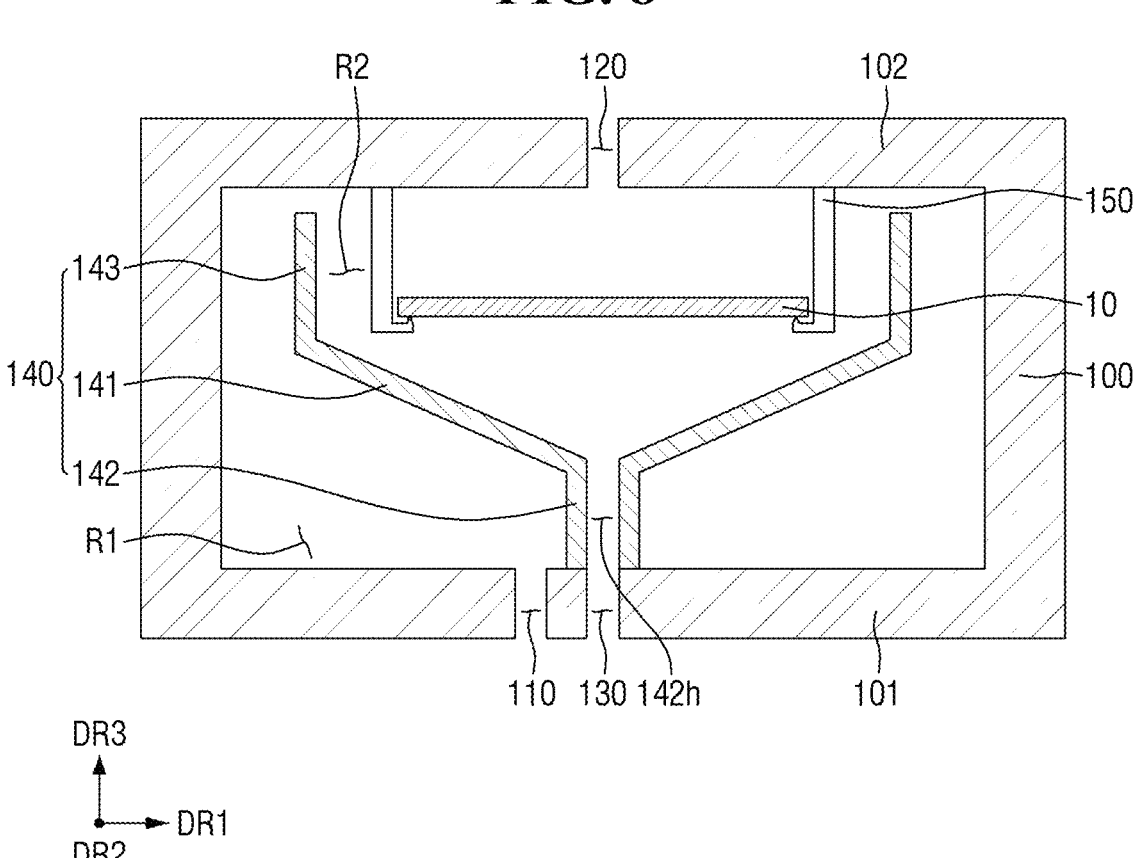

Referring to FIG. 8, by completely discharging the second fluid F2 stored in the drain cup 140 to the outside of the chamber 100, the drying process of the substrate 10 may be completed. The first fluid F1 and the second fluid F2 do not exist on the substrate 10 after the drying process is completed.

In the substrate processing apparatus and substrate processing method according to some embodiments of the present disclosure, since the supercritical fluids SF1 and SF2 are caused to flow into the chamber 100 through two paths, and the path through which the supercritical fluids SF1 and SF2 flow in, and the path through which the second fluid F2 is discharged are separated, using the drain cup 140, the second fluid F2 may be prevented from being provided to the substrate 10 again. Therefore, the substrate processing apparatus and the substrate processing method according to some embodiments of the present disclosure may reduce the number of particles remaining on the substrate 10 after the drying process.

Hereinafter, the substrate processing apparatus according to some embodiments of the present disclosure will be described referring to FIG. 9. Differences from the substrate processing apparatus shown in FIGS. 1 and 2 will be mainly described.

Figure 9:
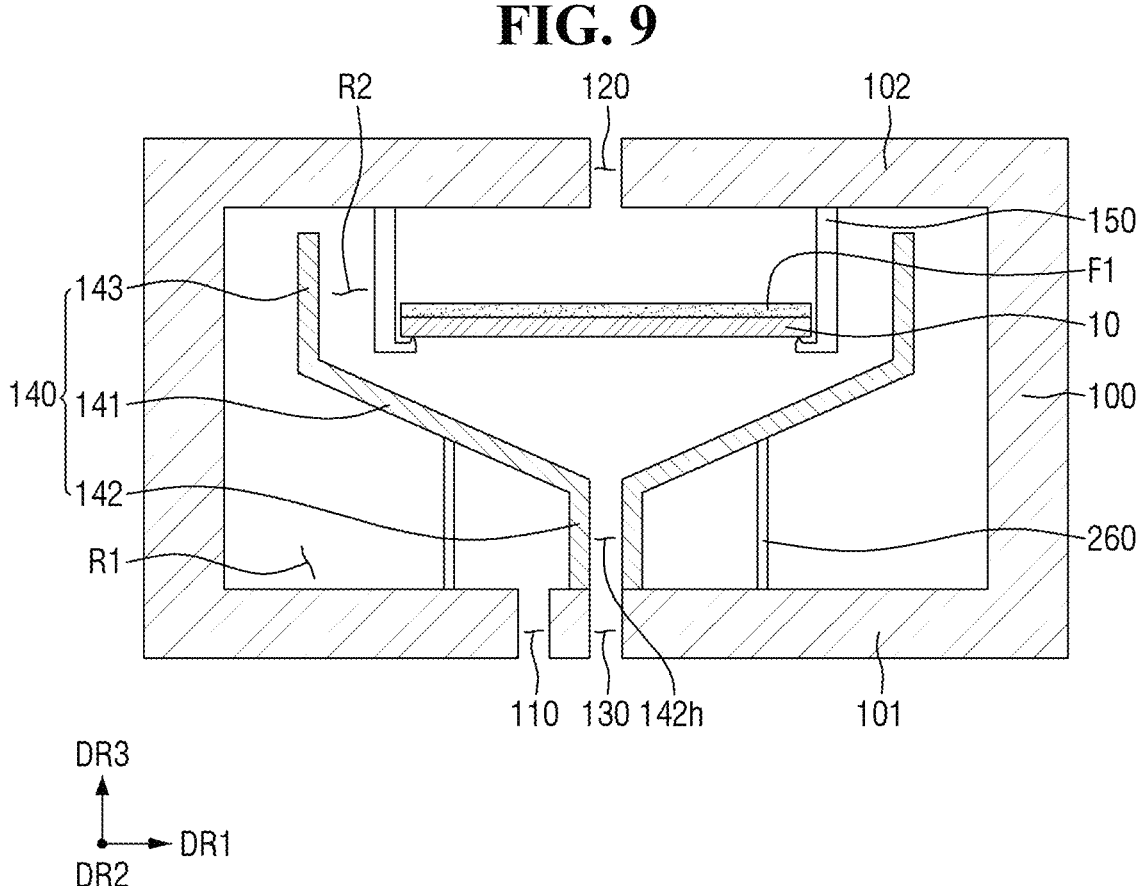
FIG. 9 is a diagram for explaining a substrate processing apparatus according to some embodiments of the present disclosure.

FIG. 9 is a diagram for explaining a substrate processing apparatus according to some embodiments of the present disclosure.

Referring to FIG. 9, the substrate processing apparatus according to some embodiments of the present disclosure may include a drain cup support 260 which is placed between the lower wall 101 of the chamber 100 and the drain cup 140 to support the drain cup 140. The drain cup support 260 may be placed in the first region R1 of the chamber 100.

The drain cup support 260 may connect the lower wall 101 of the chamber 100 and the first portion 141 of the drain cup 140 to each other. The drain cup support 260 may include a plurality of columnar structures extending from the lower wall 101 of the chamber 100 to the first portion 141 of the drain cup 140. A plurality of columnar structures may be placed to be spaced apart from each other.

Although the drain cup support 260 may include, for example, four columnar structures spaced apart from each other, the technical idea of the present disclosure is not limited thereto. For example, the number of columnar structures included in the drain cup support 260 is not limited.

The substrate processing apparatus according to some embodiments of the present disclosure may more securely support the drain cup 140, by placing the drain cup support 260 below the drain cup 140.

Hereinafter, a substrate processing apparatus according to some embodiments of the present disclosure will be described referring to FIGS. 10 and 11. Differences from the substrate processing apparatus shown in FIGS. 1 and 2 will be mainly described.

Figure 10:
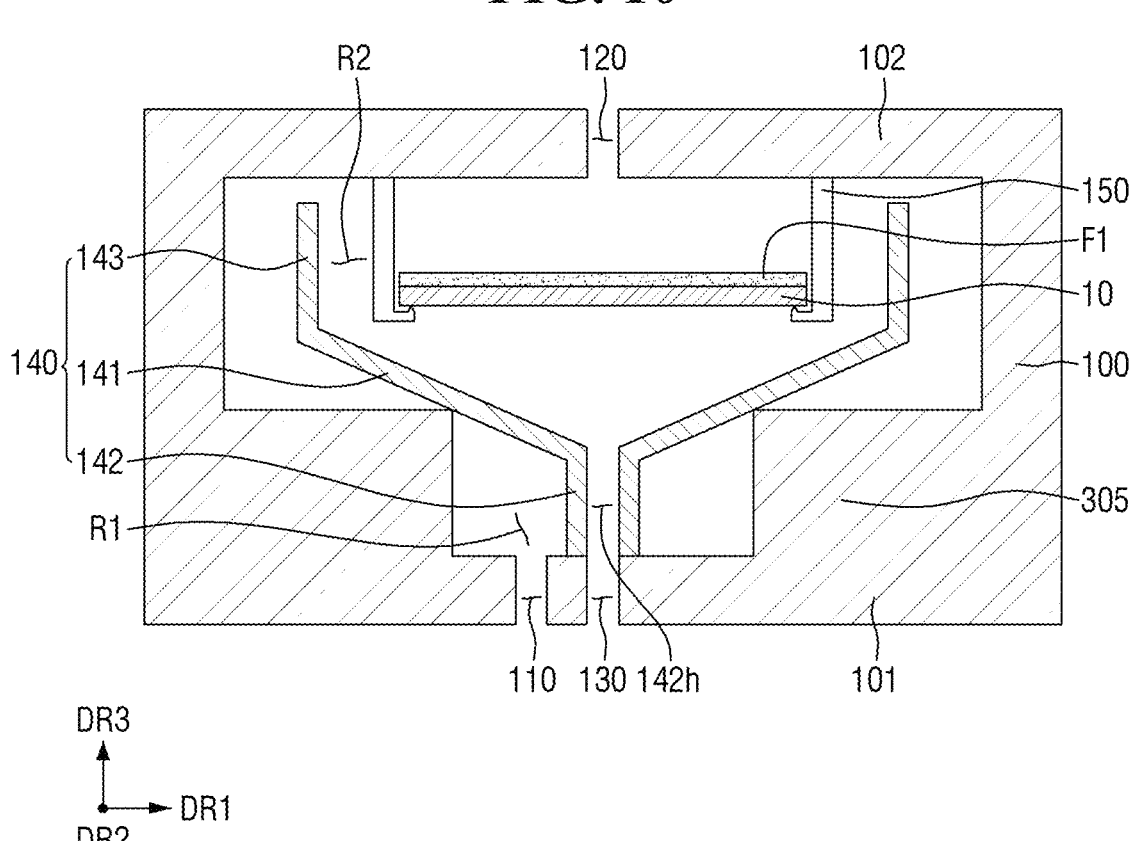
FIG. 10 is a diagram for explaining a substrate processing apparatus according to some embodiments of the present disclosure.

FIG. 10 is a diagram for explaining a substrate processing apparatus according to some embodiments of the present disclosure. FIG. 11 is a plan view for explaining the substrate processing apparatus shown in FIG. 10.

Figure 11:
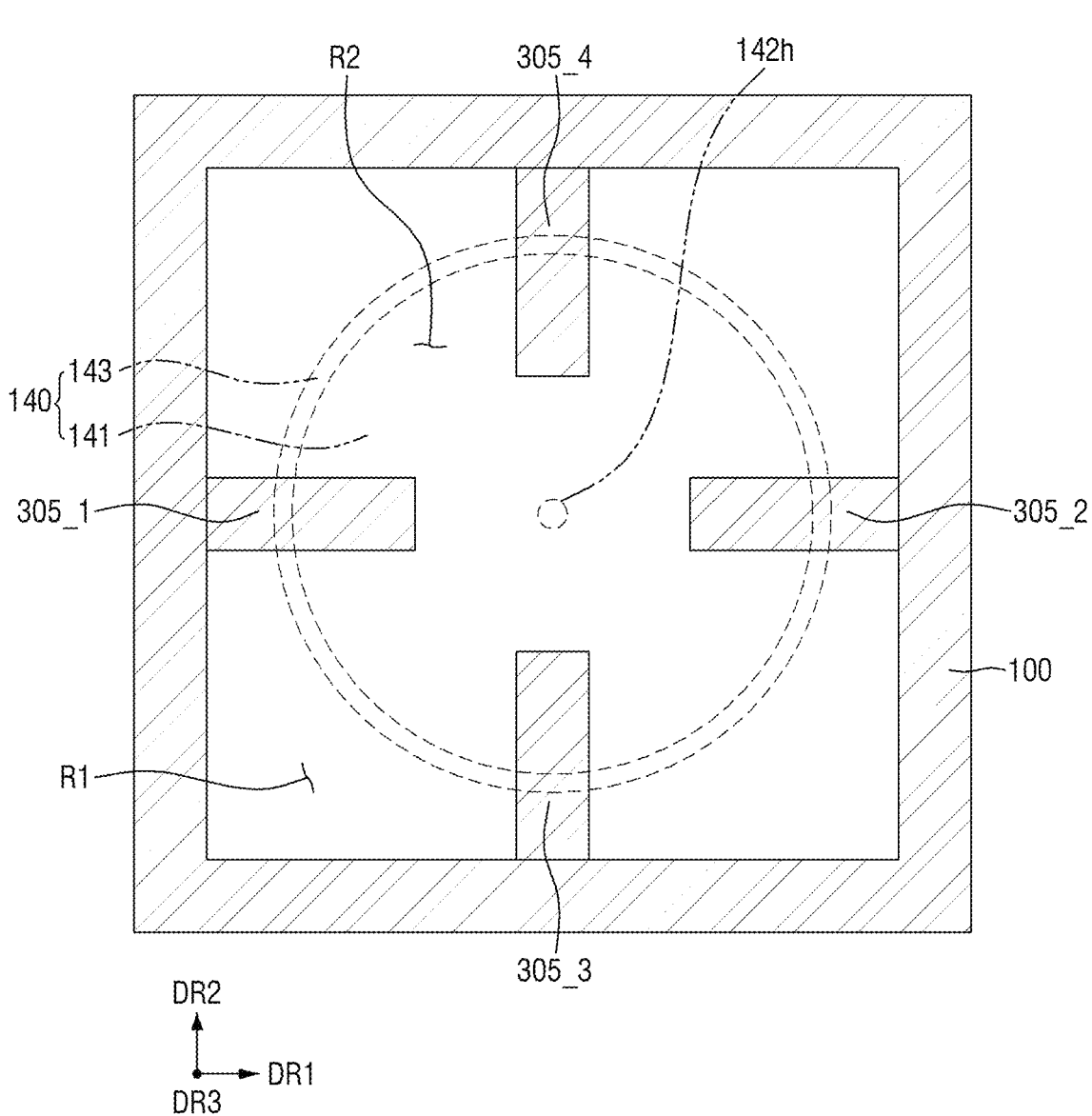
FIG. 11 is a plan view for explaining the substrate processing apparatus shown in FIG. 10.

Referring to FIGS. 10 and 11, the substrate processing apparatus according to some embodiments of the present disclosure may include a protruding portion 305 that protrudes from the lower wall 101 of the chamber 100 toward the first portion 141 of the drain cup 140. The protruding portion 305 may be placed in the first region R1 of the chamber 100.

The protruding portion 305 may protrude from each of the lower wall 101 and sidewalls of the chamber 100 toward the first portion 141 of the drain cup 140. The protruding portion 305 may be in contact with the first portion 141 of the drain cup 140 to support the drain cup 140.

The protruding portion 305 may include, for example, first to fourth protruding portions 305_1, 305_2, 305_3, and 305_4. For example, each of the first to fourth protruding portions 305_1, 305_2, 305_3, and 305_4 may protrude from each of the four sidewalls of the chamber 100.

A first protruding portion 305_1 and a second protruding portion 305_2 may be spaced apart from each other in the first horizontal direction DR1. A third protruding portion 305_3 and a fourth protruding portion 305_4 may be spaced apart from each other in the second horizontal direction DR2. The shapes and positions of the protruding portions 305 shown in FIGS. 10 and 11 are examples, and the shape and number of the protruding portions 305 are not limited.

A substrate processing apparatus according to some embodiments of the present disclosure may more securely support the drain cup 140 by placing the protruding portion 305 below the drain cup 140.

Hereinafter, a substrate processing apparatus according to some embodiments of the present disclosure will be described referring to FIGS. 12 and 13. Differences from the substrate processing apparatus shown in FIGS. 10 and 11 will be mainly described.

Figure 12:
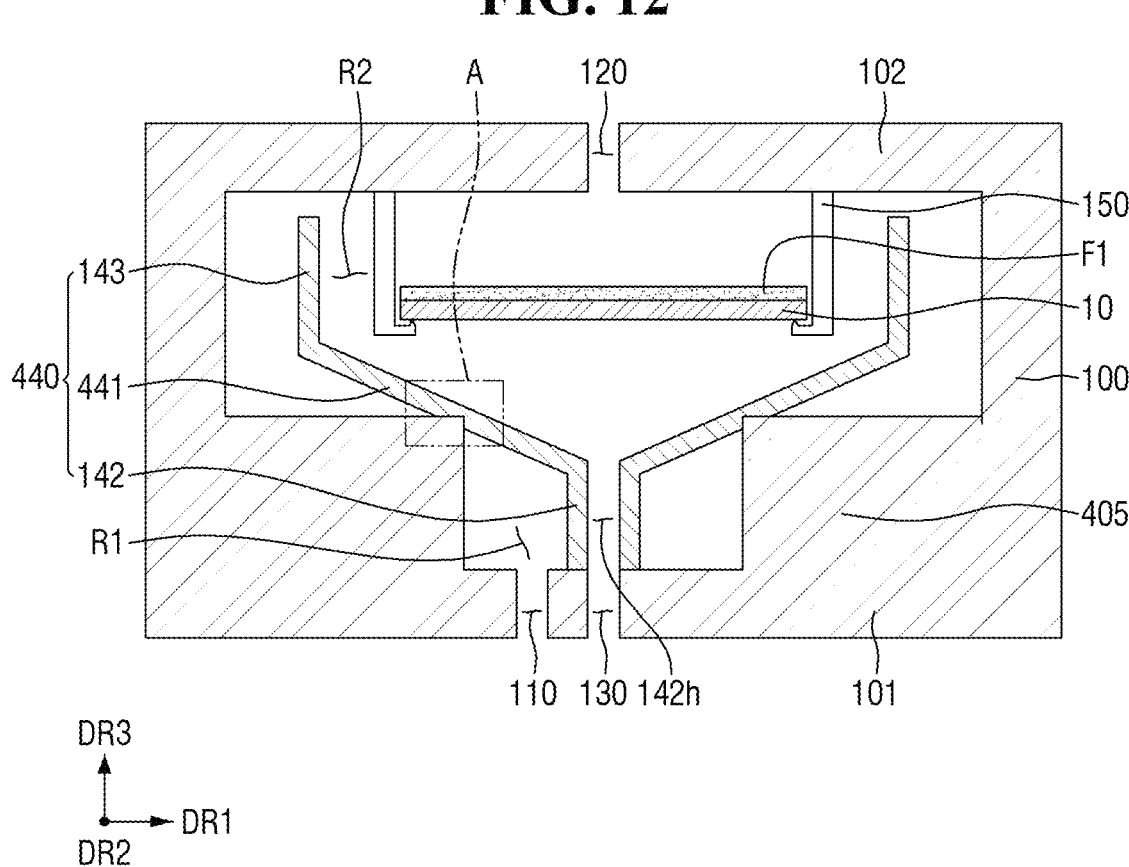
FIG. 12 is a diagram for explaining a substrate processing apparatus according to some embodiments of the present disclosure.

FIG. 12 is a diagram for explaining a substrate processing apparatus according to some embodiments of the present disclosure. FIG. 13 is an enlarged view of a region A of FIG. 12.

Figure 13:
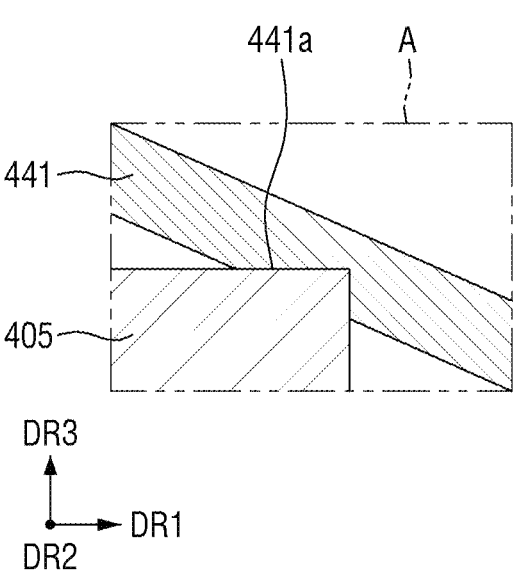
FIG. 13 is an enlarged view of a region A of FIG. 12.

Referring to FIGS. 12 and 13, the substrate processing apparatus according to some embodiments of the present disclosure may include a protruding portion 405 that protrudes from the lower wall 101 of the chamber 100 toward the first portion 441 of the drain cup 440. The protruding portion 405 may be placed in the first region R1 of the chamber 100.

The protruding portion 405 may protrude from each of the lower wall 101 and sidewalls of the chamber 100 toward the first portion 441 of the drain cup 440. The protruding portion 405 may be in contact with the first portion 441 of the drain cup 440. At least a part of the protruding portion 405 may be inserted into the inside of a connecting groove 441a formed on the lower face of the first portion 441 of the drain cup 440 to support the drain cup 440.

The substrate processing apparatus according to some embodiments of the present disclosure may more securely support the drain cup 140, by placing the protruding portion 405 below the drain cup 140.

Hereinafter, a substrate processing apparatus according to some embodiments of the present disclosure will be described referring to FIGS. 14 and 15. Differences from the substrate processing apparatus shown in FIGS. 1 and 2 will be mainly described.

Figure 14:
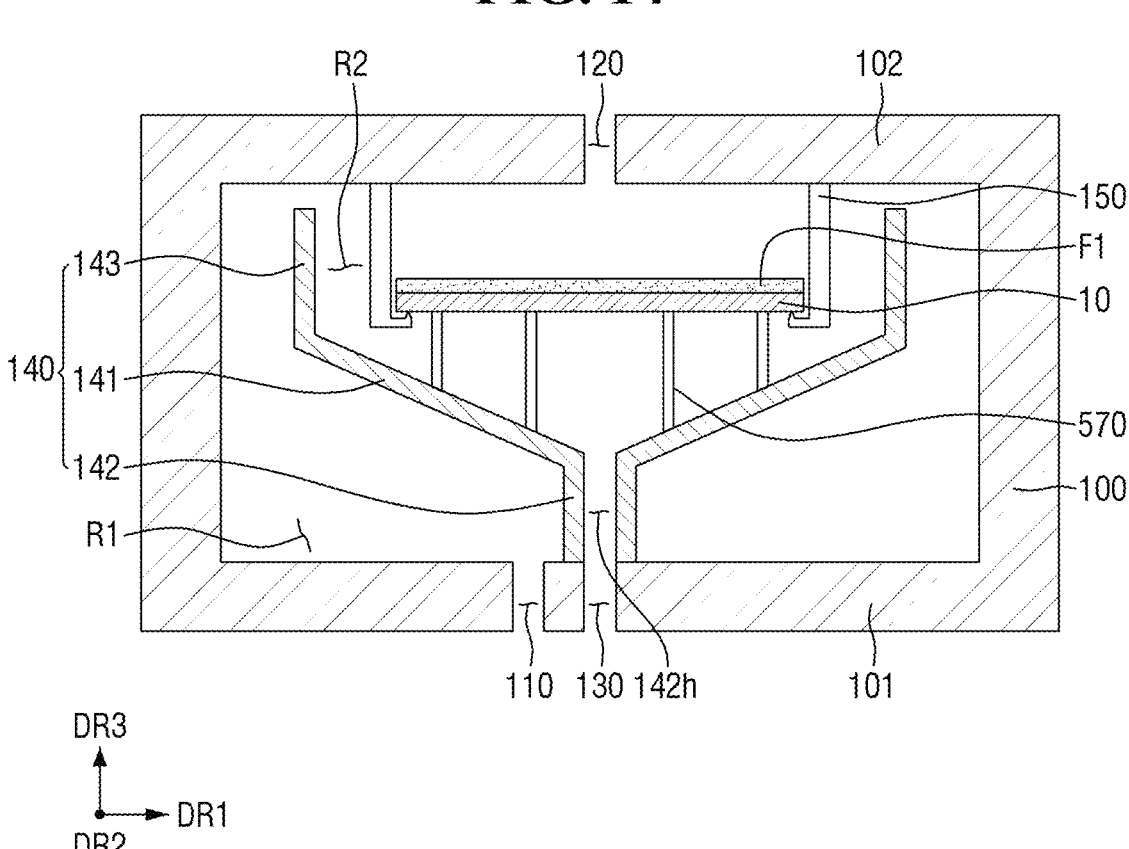
FIG. 14 is a diagram for explaining a substrate processing apparatus according to some embodiments of the present disclosure.

FIG. 14 is a diagram for explaining a substrate processing apparatus according to some embodiments of the present disclosure. FIG. 15 is a plan view for explaining the substrate processing apparatus shown in FIG. 14.

Figure 15:
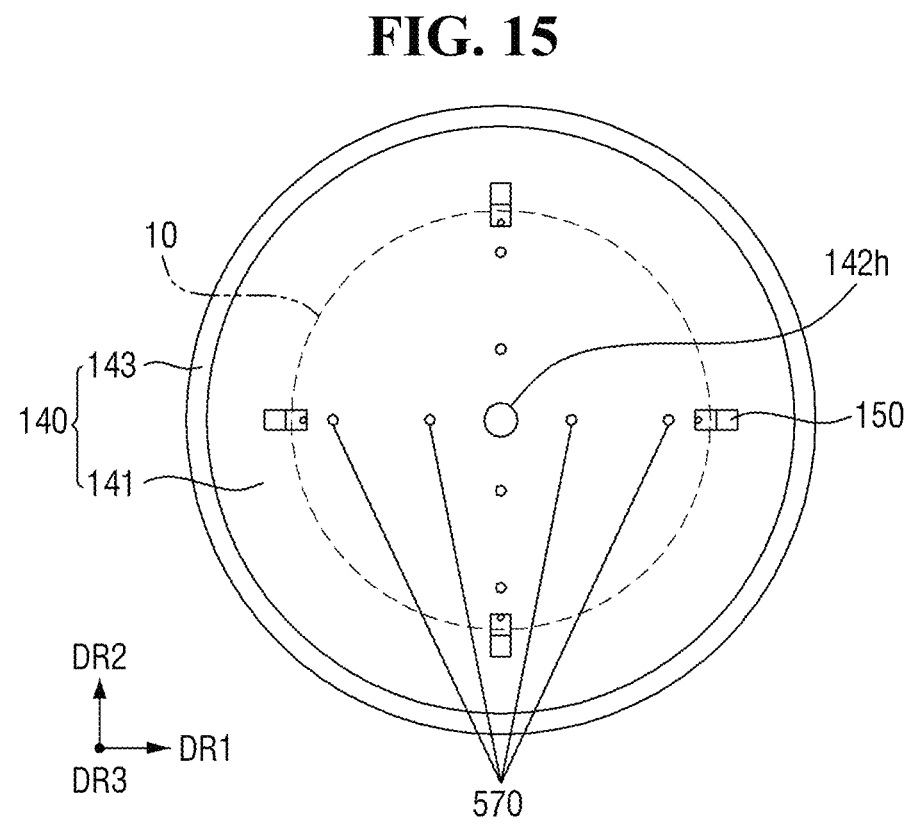

Referring to FIGS. 14 and 15, the substrate processing apparatus according to some embodiments of the present disclosure may include lower supports 570 which are placed between the substrate 10 and the drain cup 140 to support the substrate 10. The lower supports 570 may be placed in the second region R2 of the chamber 100.

The lower supports 570 may include a plurality of columnar structures extending from the first portion 141 of the drain cup 140 toward the substrate 10. The substrate 10 may be placed on the lower supports 570. The lower supports 570 may be placed where the upper support 150 is not present.

Although FIG. 15 shows that eight lower supports 570 are placed apart from each other, this is for convenience of explanation, and the number of lower supports 570 is not limited.

The substrate processing apparatus according to some embodiments of the present disclosure may more securely support the substrate 10, by placing the lower supports 570 below the substrate 10.

Hereinafter, a substrate processing apparatus according to some embodiments of the present disclosure will be described referring to FIGS. 16 and 17. Differences from the substrate processing apparatus shown in FIGS. 14 and 15 will be mainly described.

Figure 16:
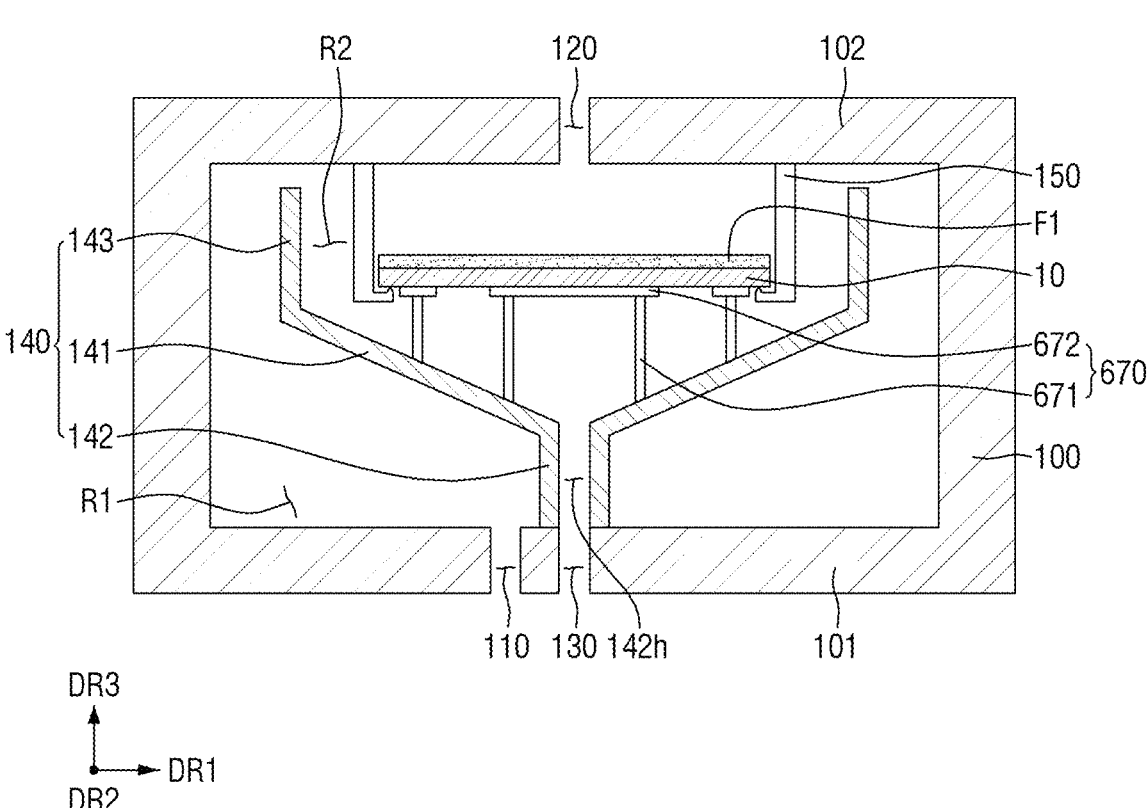
FIG. 16 is a diagram for explaining a substrate processing apparatus according to some embodiments of the present disclosure.

FIG. 16 is a diagram for explaining a substrate processing apparatus according to some embodiments of the present disclosure. FIG. 17 is a plan view for explaining the substrate processing apparatus shown in FIG. 16.

Figure 17:
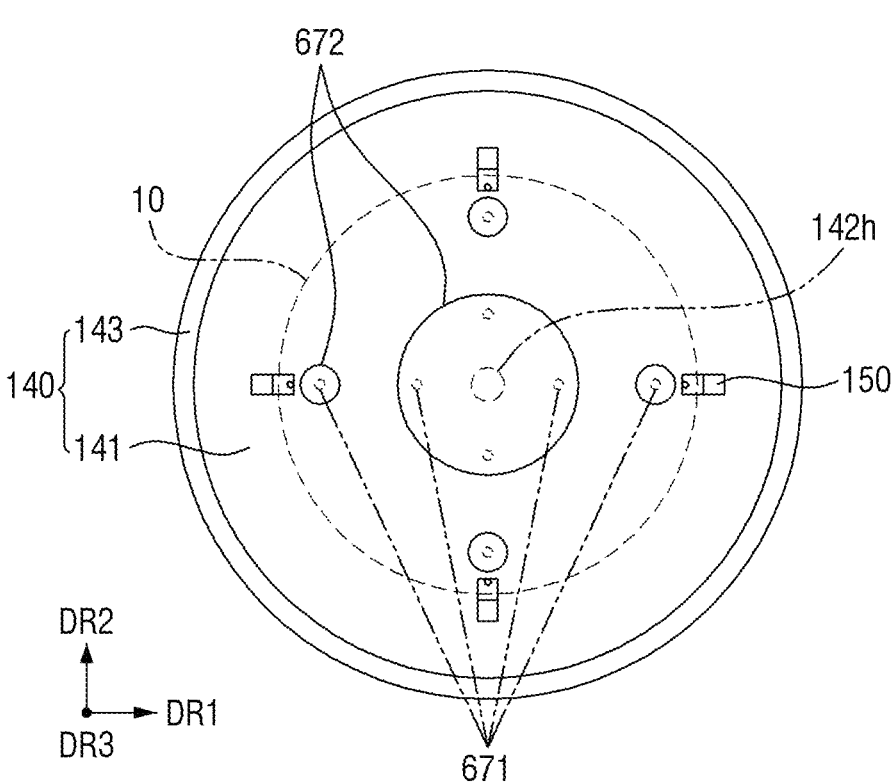
FIG. 17 is a plan view for explaining the substrate processing apparatus shown in FIG. 16.

Referring to FIGS. 16 and 17, in the substrate processing apparatus according to some embodiments of the present disclosure, a lower support 670 may include an extending portion 671 and a flat plate portion 672. The lower support 670 may be placed in the second region R2 of the chamber 100.

The extending portion 671 may include a plurality of columnar structures extending from the first portion 141 of the drain cup 140 toward the substrate 10. Although FIG. 17 shows that eight extending portions 671 are placed apart from each other, this is for convenience of explanation, and the number of extending portions 671 is not limited.

The flat plate portion 672 may be connected to the distal end of the extending portion 671. The flat plate portion 672 may be placed between the distal end of the extending portion 671 and the substrate 10. The flat plate portion 672 may include various structures having a flat plate shape.

FIG. 17 shows that one flat plate portion 672 placed below the central portion of the substrate 10 and four flat plate portions 672 placed below the edge portion of the substrate 10 are placed. However, this is for convenience of explanation, and the number of flat plate portions 672 is not limited.

One flat plate portion 672 may be placed on at least one extending portion 671. For example, the flat plate portion 672 disposed below the central portion of the substrate 10 may be placed on the four extending portions 671. Further, the flat plate portion 672 placed below the edge portion of the substrate 10 may be placed on one extending portion 671. However, this is an example, and the number of extending portions 671 that overlap one flat plate portion 672 in the vertical direction DR3 is not limited.

The substrate processing apparatus according to some embodiments of the present disclosure may more securely support the substrate 10, by placing the lower support 670 including the extending portion 671 and the flat plate portion 672 below the substrate 10.

Hereinafter, a substrate processing apparatus according to some embodiments of the present disclosure will be described referring to FIGS. 18 and 19. Differences from the substrate processing apparatus shown in FIGS. 14 and 15 will be mainly described.

Figure 18:
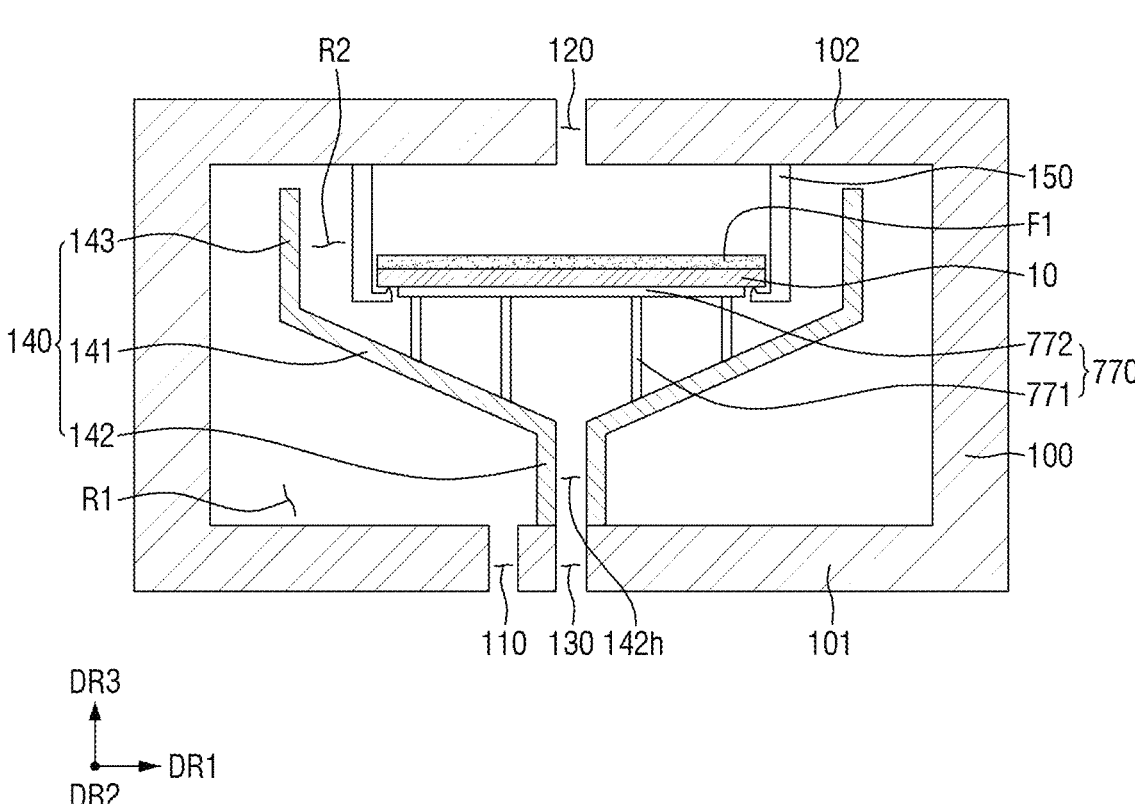
FIG. 18 is a diagram for explaining a substrate processing apparatus according to some embodiments of the present disclosure.

FIG. 18 is a diagram for explaining a substrate processing apparatus according to some embodiments of the present disclosure. FIG. 19 is a plan view for explaining the substrate processing apparatus shown in FIG. 18.

Figure 19:
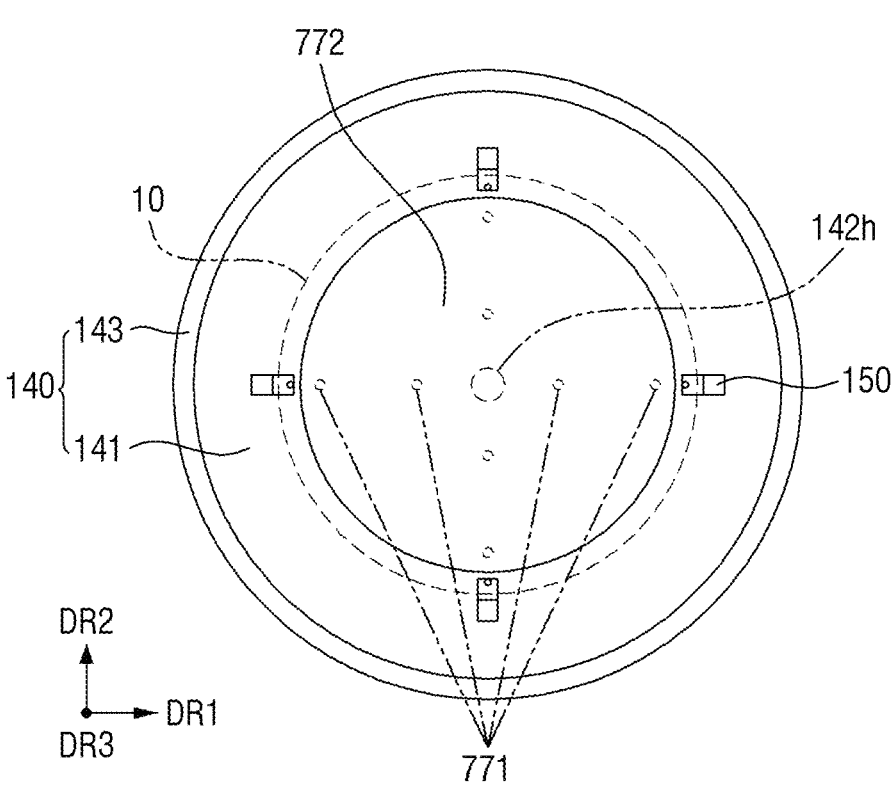
FIG. 19 is a plan view for explaining the substrate processing apparatus shown in FIG. 18.

Referring to FIGS. 18 and 19, in the substrate processing apparatus according to some embodiments of the present disclosure, a lower support 770 may include an extending portion 771 and a flat plate portion 772. The lower support 770 may be placed in the second region R2 of the chamber 100.

The extending portion 771 may include a plurality of columnar structures extending from the first portion 141 of the drain cup 140 toward the substrate 10. Although FIG. 19 shows that eight extending portions 771 are placed apart from each other, this is for convenience of explanation, and the number of extending portions 771 is not limited.

The flat plate portion 772 may be connected to the distal ends of the extending portions 771. The flat plate portion 772 may be placed between the distal end of each of the extending portions 771 and the substrate 10. The flat plate portion 772 may be formed integrally. The flat plate portion 772 may be in contact with the distal end of each of the columnar structures included in the extending portion 771.

The substrate processing apparatus according to some embodiments of the present disclosure may more securely support the substrate 10, by placing the lower support 770 including the extending portion 771 and the flat plate portion 772 below the substrate 10.

Hereinafter, a substrate processing apparatus according to some embodiments of the present disclosure will be described referring to FIGS. 20 and 21. Differences from the substrate processing apparatus shown in FIGS. 1 and 2 will be mainly described.

Figure 20:
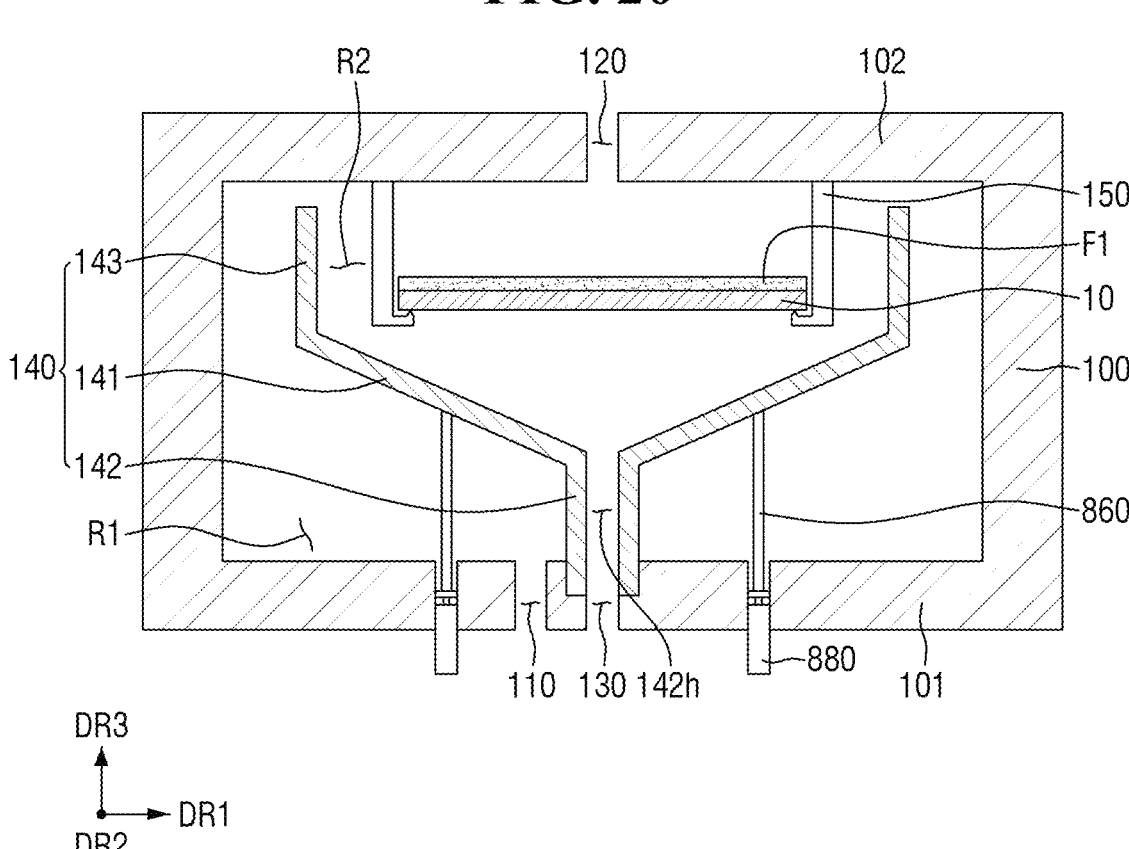
FIG. 20 is a diagram for explaining a substrate processing apparatus according to some embodiments of the present disclosure.

FIG. 20 is a diagram for explaining a substrate processing apparatus according to some embodiments of the present disclosure. FIG. 21 is a diagram for explaining the operation of the substrate processing apparatus shown in FIG. 20.

Figure 21:
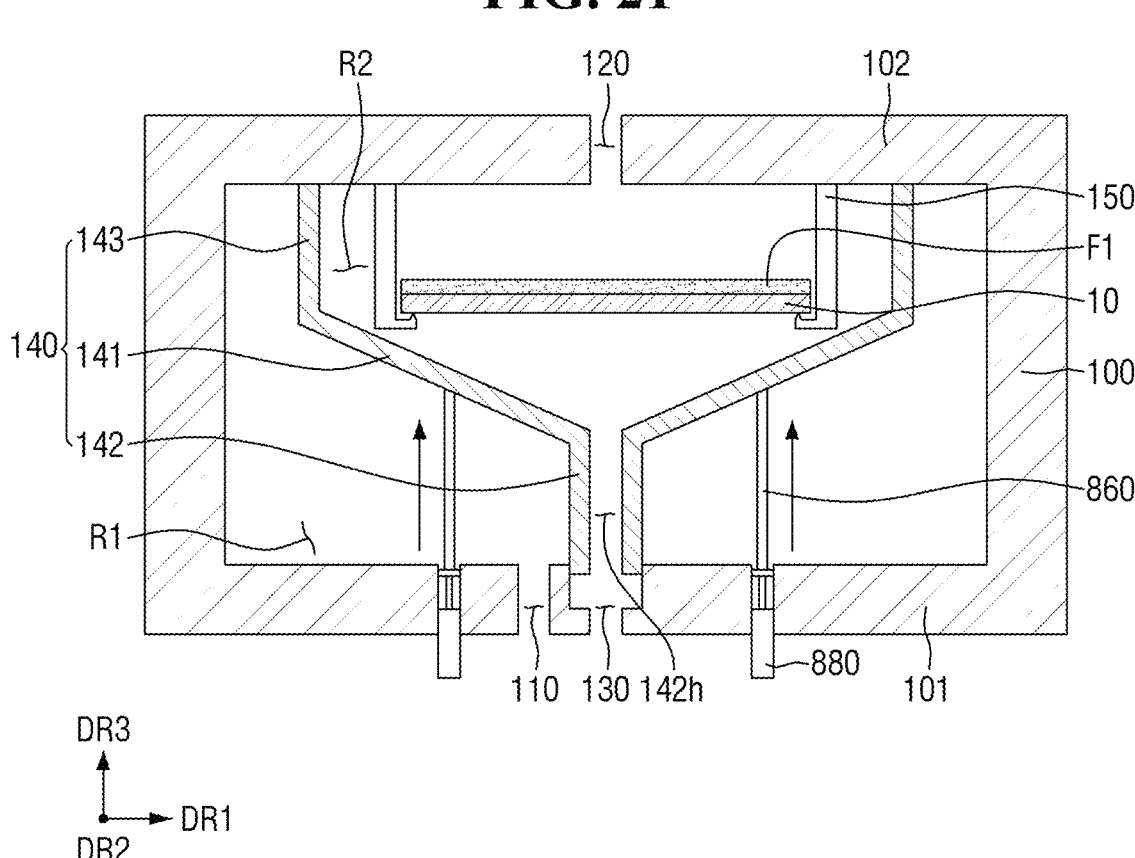
FIG. 21 is a diagram for explaining the operation of the substrate processing apparatus shown in FIG. 20.

Referring to FIGS. 20 and 21, the substrate processing apparatus according to some embodiments of the present disclosure may include a drain cup support 860 and a drain cup drive 880.

At least a part of the second portion 142 of the drain cup 140 may extend into the inside of the lower wall 101 of the chamber 100. The drain cup support 860 may be placed between the lower wall 101 and the drain cup 140 to support the drain cup 140. The drain cup support 860 may be placed in the first region R1 of the chamber 100.

The drain cup drive 880 may be placed on the lower wall 101 of the chamber 100.

However, the technical idea of the present disclosure is not limited thereto. In some embodiments, the drain cup drive 880 may be placed outside the chamber 100.

The drain cup drive 880 may be connected to the lower part of the drain cup support 860. The drain cup drive 880 may move the drain cup support 860 in the vertical direction DR3. The drain cup drive 880 may move the drain cup support 860 in the vertical direction DR3, thereby moving the drain cup 140 supported by the drain cup support 860 in the vertical direction DR3.

The drain cup drive 880 may include an actuator that moves the drain cup support 860 in the vertical direction DR3. Although the actuator may be, for example, a hydraulic cylinder, the technical idea of the present disclosure is not limited thereto.

As shown in FIG. 21, the drain cup drive 880 moves the drain cup 140 in the vertical direction DR3 so that the upper part of the drain cup 140 contacts the upper wall 102 of the chamber 100 to completely block the second region R2 of the chamber 100 from the first region R1 of the chamber 100. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Since the second region R2 of the chamber 100 is completely blocked from the first region R1 of the chamber 100 in the step (e.g., S140) as shown in FIG. 7 where the second supercritical fluid SF2 is provided to the second region R2 of the chamber 100 and the second fluid F2 is discharged to the outside of the chamber 100, the second fluid F2 may be effectively discharged.

Although the embodiments of the present disclosure have been described above referring to the attached drawings, the present disclosure is not limited to the embodiments and may be produced in various different forms. Those skilled in the art will appreciate that the invention may be implemented in other specific forms without changing the technical ideas and essential features of the present disclosure. Therefore, the disclosed embodiments of the invention are used in a generic and descriptive sense only and not for purposes of limitation.

What is claimed is:

1. A method of fabricating a semiconductor device, the method comprising:

providing a substrate to an inside of a chamber, wherein the substrate is coated with a first fluid;

providing a first supercritical fluid to the inside of the chamber through a lower inlet formed in a lower wall of the chamber;

storing a second fluid formed by a mixture of the first fluid and the first supercritical fluid inside a drain cup placed between the lower wall of the chamber and the substrate;

providing a second supercritical fluid to the inside of the chamber through an upper inlet formed in an upper wall of the chamber; and discharging the second fluid stored in the drain cup to the outside of the chamber through a fluid outlet formed in the lower wall of the chamber, wherein the drain cup includes a first portion of which a width, in a horizontal direction, decreases toward the lower wall of the chamber, and a second portion which connects the first portion and the fluid outlet to each other, wherein the chamber includes a first region and a second region separated by the drain cup, the first region being formed between the drain cup and an inner wall of the chamber, and the second region includes an inside of the drain cup, wherein said second region is surrounded by the drain cup, wherein the second portion of the drain cup is fixedly attached to a first position of the lower wall of the chamber, wherein the first position of the lower wall of the chamber is disposed between the lower inlet and the fluid outlet, and wherein the drain cup is located above the lower wall of the chamber, and a gap is located between the first portion of the drain cup and the lower wall of the chamber, wherein the drain cup further includes a connecting groove formed in the first portion of the drain cup, wherein at least a part of a first protrusion portion of the chamber is inserted into the connecting groove of the drain cup, wherein the chamber and the lower inlet are configured such that the first supercritical fluid is provided to the first region, and wherein the chamber and the upper inlet are configured such that the second supercritical fluid is provided to the second region.

2. The method of claim 1, wherein the first supercritical fluid is continuously provided to the inside of the chamber, until the second supercritical fluid is provided to the inside of the chamber.

* * * * *